United States Patent [19]

Hu

[11] Patent Number: 5,096,802
[45] Date of Patent: Mar. 17, 1992

[54] HOLES AND SPACES SHRINKAGE

[75] Inventor: Hung-Kwei Hu, Saratoga, Calif.

[73] Assignee: Hewlett-Packard Company, Palo Alto, Calif.

[21] Appl. No.: 611,270

[22] Filed: Nov. 9, 1990

[51] Int. Cl.⁵ .................................................. G03F 7/40
[52] U.S. Cl. ..................................... 430/328; 430/330; 430/331; 430/394
[58] Field of Search ................... 430/8, 328, 330, 331, 430/394

[56] References Cited

U.S. PATENT DOCUMENTS 4,548,688  10/1985  Matthews ........................... 430/330

FOREIGN PATENT DOCUMENTS 59-99723   6/1984  Japan .................................. 430/330
61-166130  7/1986  Japan .................................. 430/330
62-129849  6/1987  Japan .................................. 430/330

OTHER PUBLICATIONS

Badami et al., "Photoresist Reflow Reversal", IBM Technical Disclosure, vol. 26, No. 10A, Mar. 1984, pp. 5094-5095.

Primary Examiner—Marion E. McCamish
Assistant Examiner—Kathleen Duda

[57] ABSTRACT

A controllable feature shrinkage technique permits shrinkage of feature sizes beyond the capability of current lithographic tools by using high temperature flow to shrink the conventionally formed resist image of the feature and then deep UV exposure to stabilize the resist profile at the desired reduced size. A preliminary partial stabilization using hard bake and low intensity deep UV exposure reduces the rate of resist flow at temperature, permitting better control and repeatability of the amount of shrinkage. Feature sizes in the range of about 0.15 μm may be achieved.

9 Claims, 1 Drawing Sheet

HOLES AND SPACES SHRINKAGE

BACKGROUND OF THE INVENTION

1. Field of the Invention

This invention relates to lithographic techniques used in micromachining and the manufacture of printed circuit patterns such as those on integrated circuits (IC's), printed circuit boards and other electronic components and packaging subassemblies. In particular, this invention relates to techniques for positive photoresist treatment during photolithographic processing that provide enhancement of the ability of conventional photolithographic processes to control and achieve small feature sizes.

2. Description of the Prior Art

In conventional processes for micromachining and fabricating printed circuit patterns on printed circuit boards, IC,'s and other circuit components, a layer of a photoresist material is first formed on a silicon, dielectric, conducting or other surface layer, such as the oxide surface layer of a dielectric film. The photoresist is then exposed by white light in the desired pattern to be formed. The resist is then developed to remove the exposed portions of the resist, leaving an image of unexposed resist protecting the portions of the layer to be preserved to form the circuit.

The partially resist covered layer is then exposed to an etching process which removes those portions of the surface layer not protected by the developed resist image. The developed resist is stripped from the component, leaving the unetched surface layer in the desired pattern. The process may be repeated to build up multiple layers of circuitry, separated by layers of other materials. The minimum dimension of pattern features that may be accurately and consistently created by the photoresist process is an important parameter of the manufacturing process because it tends to control the density of component placement that may be achieved after fabrication.

The clear historical trend is toward smaller sizes for micromachining and greater and greater component and signal density. The continuing demand has therefore been for techniques for fabricating features of smaller and smaller sizes. Various approaches have been tried to achieve these smaller feature sizes, such as e-beam and x-ray lithography, but such techniques have not been widely adopted in place of conventional microlithographic techniques.

One of the main limiting problems in achieving submicron feature sizes with conventional techniques is the difficulties encountered in the control of the shape and dimensions of the developed photoresist image before and during the etching away of the exposed surface layer.

It is necessary during such subsequent processing to subject the developed photoresist image to relatively harsh conditions during processes such as plasma etch and ion implantation. The conventional technique used to enhance the ability of the photoresist pattern to withstand such harsh conditions requires the exposure of the photoresist pattern to high temperatures in order to promote cross linkage of polymers in the photoresist materials. The cross linkage of the photoresist polymers is believed to substantially improve the strength of the material and its ability to withstand harsh conditions.

However, most available photoresist materials will flow or deform at elevated temperatures, typically in the range of about 150° C. The temperatures used to promote cross linkages will cause such deformation. One widely accepted technique to prevent resist flow at higher temperatures is to expose the resist pattern to deep ultraviolet radiation, known as deep UV, combined with a high temperature bake at temperatures on the order of 200° C. The combined exposure to deep UV and high temperatures has successfully permitted the fabrication of circuit patterns and micromachined features utilizing relatively harsh processes without substantial changes of geometry.

Feature size is controlled having the lithographic tools available and current minimum feature sizes are the range of 0.6 to 0.8 $\mu$m. What are needed, however, are improved techniques consistently yielding smaller feature sizes in the range of about 0.1 to 0.2 $\mu$m.

SUMMARY OF THE INVENTION

The preceding and other shortcomings of the prior art are addressed and overcome by the present invention that provides a controllable feature shrinkage technique that permits shrinkage of feature sizes, such as contact holes, spaces and the like, beyond the capability of current lithographic tools by using high temperature flow to shrink the conventionally formed resist image of the feature and then stabilize the image, by for example deep UV exposure, to freeze the resist profile at the desired reduced size. A preliminary hard bake and low intensity deep UV exposure may be used to partially stabilize the image to reduce the rate of resist flow with elevated temperature, permitting better control and repeatability of the amount of shrinkage.

In a further aspect, the present invention provides a photolithographic process for producing components with reduced feature sizes by first creating a resist image including a feature of a first size, heating the resist image to cause the resist to flow and reduce the feature size in the image, stabilizing the image and then fabricating the electronic component from the flowed and stabilized resist image.

These and other features and advantages of this invention will become further apparent from the detailed description that follows which is accompanied by a set of drawing figures. In the figures and description, numerals indicate the various features of the invention, like numerals referring to like features throughout both the drawings and the description.

DETAILED DESCRIPTION OF THE PREFERRED EMBODIMENT

Figure 1:
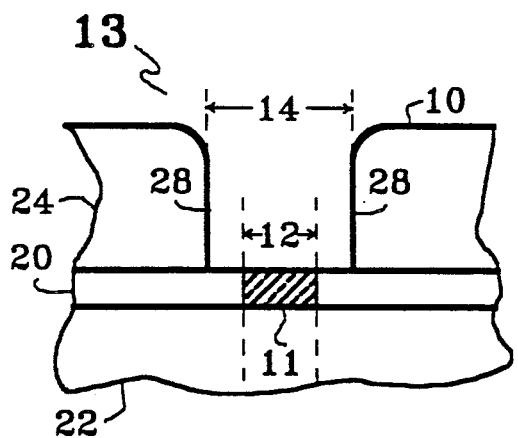
FIG. 1 is a cross sectional view of a portion of a partially fabricated component, including a resist image to be reduced to achieve a reduced feature size according to the present invention.

FIG. 1 is a cross sectional view of a portion of partially fabricated component 13 including developed resist image 10, shown with an exaggerated thickness for clarity, for creating reduced size circuit feature 11 by subsequent processing. The critical minimum dimension for reduced size circuit feature 11 is shown in the figure as dimension 12.

Reduced size circuit feature 11 may be any one of a number of known features, such as an opening in a dielectric or conducting layer or an area to be doped or etched in a semiconducting wafer or the space between lines on a circuit layer.

For convenience, reduced size circuit feature 11 will be described hereinbelow as a hole or opening in dielectric film layer 20. Dielectric layer 20 may conveniently be formed on a conducting or semiconducting layer, shown as conducting layer 22. In this example, feature 11 may be a hole or opening through dielectric film layer 20 permitting electrical contact to conducting layer 22.

Such openings are often used to form vias by applying another conducting layer, not shown, above dielectric film layer 20. The application of this upper conducting layer would cause feature 11 to be at least partially filled with conducting material so that an electrical connection is provided for the upper layer through the via in dielectric film layer 20 to conducting layer 22.

The techniques of the present invention may also be used to develop submicron circuit features in conducting or semiconducting layers. Such features may, for example, provide control of the periphery of an area to be doped or etched. In this situation, reduced size circuit feature 11 would represent the area to be doped or echoed and layers 20 and 22 might represent a portion of the semiconductor material to be doped within the boundaries of dimension 12, to the exclusion of the immediate adjoining areas on the surface of layer 20.

Returning now to the example shown in FIG. 1 in which reduced size Circuit feature 11 is an opening to be formed in dielectric film layer 20, developed resist image 10 may be formed by conventional techniques from photoresist layer 24 of conventional photolithographic resist materials. After exposure of photoresist layer 24 through an appropriate mask not shown, an exposed portion of the photoresist within mask feature dimension 14 may be removed during development of the resist.

Conventional processes may be used to form developed resist image 10 which includes mask feature dimension 14. It is important to note however that mask feature dimension 14 actually formed within developed resist image 10 may be substantially larger than dimension 12 of the desired reduced size circuit feature 11. If layer 20 were exposed to an etchant while developed resist image 10 were in the form shown in FIG. 1, feature 11 would be the wider mask feature dimension 14. In conventional photolithographic processes for fabricating IC's, mask feature dimension 14 would be on the order of 0.6 to 0.8 μm.

Figure 2:
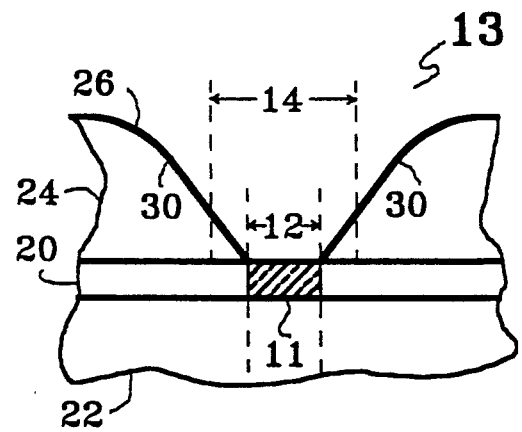
FIG. 2 is a cross sectional view of the portion of a reduced resist image shown in FIG. 1 after one or more cycles of partial flowing and deep UV exposure according to the present invention.
Figure 3:
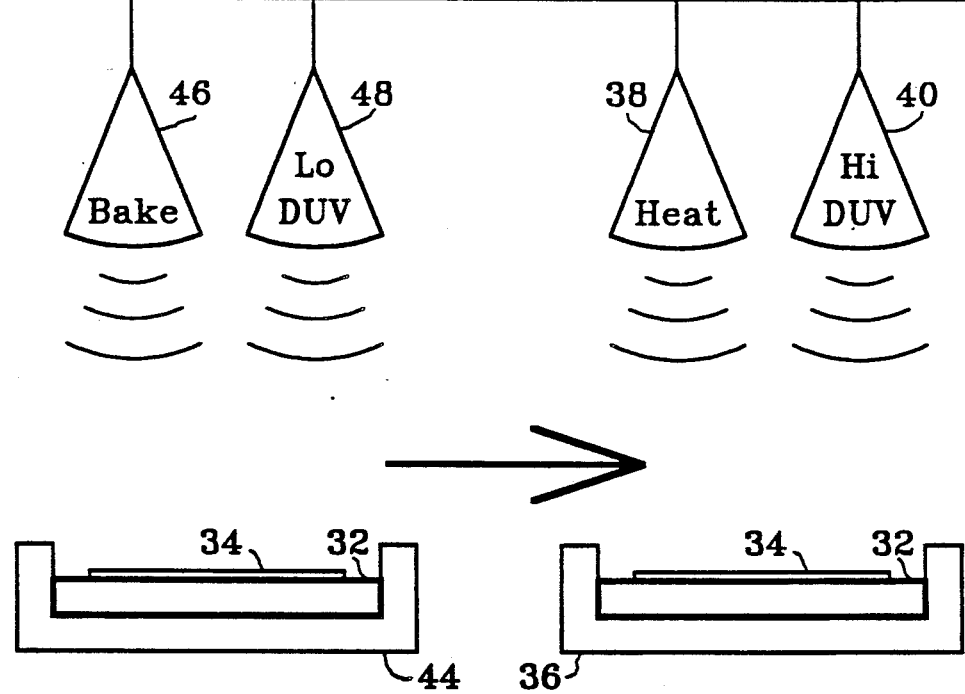
FIG. 3 is a schematic illustration of a portion of an IC fabrication line which illustrates two stations for partial flowing and deep UV exposure according to the present invention.

Further processing, described in more detail with regard to FIGS. 2 and 3, is required to achieve the desired dimension 12 for reduced size circuit feature 11. In accordance with the present invention, mask feature dimension 14 may be reduced to form dimension 12 to as small as about 0.1 to 0.2 μm using otherwise conventional techniques for fabricating IC's.

Referring now to FIG. 2, partially fabricated component 13 is shown after reflow processing according to the present invention. The required reflow processing will be described in greater detail with regard to FIG. 3, below. After such reflow processing, the shape of developed resist image 10 is altered as shown in flowed resist image 26.

The difference between developed resist image 10 and flowed resist image 26 may easily be seen from a comparison of FIGS. 1 and 2. In FIG. 1, side walls 28 of developed resist image 10 surrounding mask feature dimension 14 are relatively steep which is in accordance with good conventional photolithographic processing techniques. In fact, the distance between side walls 28 where they contact conducting layer 20 is mask feature dimension 14.

In flowed resist image 26, as shown in FIG. 2, side walls 28 of resist image 10 have been deformed and begun to flow together to form sloped walls 30. The distance between sloped walls 30 has been reduced from mask feature dimension 14 to dimension 12 suitable for creating reduced size circuit feature 11.

After appropriate further processing by, for example the application of etchant to partially fabricated component 13 as shown in FIG. 2, the unprotected portion of layer 20 may be removed to form reduced size circuit feature 11, an extremely fine opening through dielectric film layer 20.

The required reflow processing to form flowed resist image 26, shown in FIG. 2, from developed resist image 10, shown in FIG. 1, will now be described in greater detail with respect to FIG. 3. Wafer 32 includes developed resist image layer 34 within which are one or more developed resist images 10 created by conventional processing.

Wafer 32 is first processed to the stage at which developed resist image 10 has been formed. Wafer 32 is then transferred to hot plate chuck 36 by a conventional sending cassette or other means, not shown. Hot plate chuck 36 serves to position wafer 32 for heating by heating element 38 and irradiation by high intensity deep UV element 40, the operation of both of which is controlled by reflow processing control 42.

In a first preferred embodiment of the present invention, shown on the right side of FIG. 3, reflow processing control 42 may be used to reflow developed resist image layer 34 on wafer 32 positioned in hot plate chuck 36 at a predetermined temperature for a preselected time after which the partially flowed pattern is then stabilized by exposure to high intensity deep UV from high intensity deep UV element 40.

The resultant flowed pattern will be similar to flowed resist image 26 shown in FIG. 2 in which photoresist layer 24 has flowed to form sloped walls 30 in flowed resist image 26. In this manner, reduced size circuit feature 11 may be created with dimension 12 substantially smaller than mask feature dimension 14.

Although the above described process for creating reduced size circuit feature 11 will work, it is difficult to achieve accuracy and consistency because photoresist flows very quickly. This makes the amount of resist flow, and therefore the amount of shrinkage, difficult to control. A second preferred embodiment of the present invention encompasses both right and left sides of FIG. 3 and uses a process for improved dimensional control.

In the second preferred embodiment, the stabilization cycle using heat and high intensity deep UV is preceded by a partial stabilization step using a hard bake and low intensity deep UV cycle which serves to slow down the flow of resist for better control. In this technique, wafer 32 is first transferred to hot plate chuck 44 on the left side of FIG. 3 by a conventional transfer system, not shown.

Hot plate chuck 44 serves to position wafer 32 for heating by baking element 46. This process is similar to the conventional hard bake process in which a moderate heating is applied to the developed resist image to drive out any remaining solvent or absorbed water. It is important to return the resist image to a known, standardized condition for improved manufacturing and control. It has been found convenient to have reflow processing control 42 to control this first, standardization step to provide heating in the range of 135° C. for about 5-7 minutes.

During the last 5 to 8 seconds of the baking step, a partial stabilization is promoted by exposing wafer 32 to a low intensity deep UV radiation from low intensity deep UV element 48. This partial stabilization is widely believed to result from partial polymer cross linkage in the resist. The deep UV intensity is in the range of about 100 watts/cm$^2$. This partial stabilization results in substantially reduced resist flow rate for a given temperature in later processing steps, as described below.

After completion of the baking step and low intensity deep UV exposure, wafer 32 may be transferred from hot plate chuck 44 to hot plate chuck 36 by conventional transfer mechanisms, not shown. Hot plate chuck 36 serves to position wafer 32 for heating by heating element 38. Heating element 38 may be controlled by reflow processing control 42 to provide sufficient heat for a predetermined short time interval to controllably reflow developed resist image layer 34, effectively reducing the feature size. A temperature on the order of 160° C. for a period of about 20 seconds has been used to flow the resist to shrink the feature sizes.

Thereafter reflow processing control 42 controls high intensity deep UV element 40 to expose wafer 32 to a higher level of irradiation, on the order of about 700 watt/cm$^2$, for about 100 seconds to stabilize the resist image. This high intensity deep UV irradiation freezes the resist pattern to stop further resist flow and permits subsequent processing in harsh environments for etching or doping, as described above.

Because of the substantially longer time required for processing on hot plate chuck 44 than required on hot plate chuck 36, it may be convenient to have multiple chucks for positioning several wafers for hard bake and low intensity deep UV at the same time.

Control of the shape of the flowed resist, particularly in order to achieve deep and/or extremely small feature structure, may be enhanced by use of gradient filters to control the pattern of irradiation.

The process described above has been demonstrated with CMOS circuitry fabricated with otherwise conventional lithographic processes for creating reduced size circuit features sizes. After application of the steps of the present invention, conventionally achieved 0.9 $\mu$m features were reduced to about 0.15 $\mu$m feature size.

The temperatures, deep UV radiation intensities and the length of such exposures given above are meant as representative examples and apply to the fabrication of IC components with certain conventional photolithographic processes. It is well within the skill of a person of ordinary skill in these arts to tailor the temperatures, times and radiation intensities to suit particular processes, features and components.

While this invention has been described with reference to its presently preferred embodiment, its scope is not limited thereto. Rather such scope is only limited insofar as defined by the following set of claims and includes all equivalents thereof.

What is claimed is:

1. A photolithographic process for producing a component with reduced feature sizes, comprising the steps of:
   creating a positive photoresist image including a feature of a first size;
   partially stabilizing the resist image by exposure to deep UV radiation, before causing the resist to flow, to reduce the normal flow rate of the resist;
   causing the resist image to flow at the reduced rate to reduce the feature size in the image; then
   exposing the flowed image to high intensity deep UV radiation to freeze the flowing resist image; and
   fabricating the component from the flowed and stabilized resist image.

2. The process claimed in claim 1 wherein the partial stabilization step further comprises the steps of:
   baking the resist image; and
   exposing the image to deep UV radiation having an intensity lower than the intensity of the deep UV radiation used to freeze the flowed resist image.

3. The process claimed in claim 2 wherein the baking step heats the resist image to a temperature of about 135° C. for about 5 to 7 minutes.

4. The process claimed in claim 2 wherein the lower intensity deep UV radiation step exposes the resist image to about 100 watts/cm$^2$ of deep UV radiation.

5. The process claimed in claim 4 wherein the lower intensity deep UV radiation is applied for about 5 to 8 seconds.

6. The process claimed in claim 5 wherein the lower intensity deep UV radiation is applied to the resist near the end of the baking cycle.

7. The process claimed in claim 2 wherein the high intensity deep UV radiation exposes the resist image to about 700 watts/cm$^2$ of deep UV radiation.

8. The process claimed in claim 7 wherein the high intensity deep UV radiation is applied to the resist image for about 100 seconds.

9. The process claimed in claim 1 wherein the resist image is caused to flow by heating the resist image to a temperature of about 160° C. for about 20 seconds.

* * * * *